United States Patent
Sorensen (10) Patent No.: US 8,163,191 B2
(45) Date of Patent: Apr. 24, 2012

(54) APPARATUS AND METHODS FOR USING HIGH FREQUENCY CHOKES IN A SUBSTRATE DEPOSITION APPARATUS

(75) Inventor: Carl A. Sorensen, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/178,448

(22) Filed: Jul. 7, 2011

(65) Prior Publication Data

US 2011/0259362 A1  Oct. 27, 2011

Related U.S. Application Data

(62) Division of application No. 11/514,676, filed on Sep. 1, 2006, now abandoned.

(60) Provisional application No. 60/714,723, filed on Sep. 6, 2005.

(51) Int. Cl.
- B44C 1/22 (2006.01)
- C03C 15/00 (2006.01)
- C03C 25/68 (2006.01)
- C23F 1/00 (2006.01)

(52) U.S. Cl. .................... 216/68; 156/345.48

(58) Field of Classification Search ............ 216/68; 156/345.48
See application file for complete search history.

(56) References Cited

U.S. PATENT DOCUMENTS

| | | | |
|---|---|---|---|
| 4,116,791 A | 9/1978 | Zega | |
| 4,657,618 A | 4/1987 | Spencer et al. | |
| 4,774,437 A | 9/1988 | Helmer et al. | |
| 4,865,712 A | 9/1989 | Mintz | |
| 4,960,753 A | 10/1990 | Collins et al. | |
| 5,061,838 A | 10/1991 | Lane et al. | |
| 5,158,660 A | 10/1992 | Devigne et al. | |
| 5,178,739 A | 1/1993 | Barnes et al. | |
| 5,234,529 A | 8/1993 | Johnson | |
| 5,288,971 A | 2/1994 | Knipp | |
| 5,505,780 A | 4/1996 | Dalvie et al. | |
| 5,681,434 A | 10/1997 | Eastlund | |
| 5,755,886 A | 5/1998 | Wang et al. | |
| 5,772,772 A | 6/1998 | Chi et al. | |
| 5,773,100 A | 6/1998 | Chang et al. | |

(Continued)

FOREIGN PATENT DOCUMENTS

JP   61-284573   12/1986

(Continued)

OTHER PUBLICATIONS

Office Action of U.S. Appl. No. 12/344,210 mailed Aug. 29, 2011.

(Continued)

*Primary Examiner* — Roberts Culbert
(74) *Attorney, Agent, or Firm* — Dugan & Dugan, PC (57) ABSTRACT

In certain aspects, a substrate deposition apparatus, including a gas tube coupled to a gas source, an RF power source and a substrate processing chamber, is provided. The gas tube is adapted to carry process gas and cleaning plasma from the gas source/remote plasma gas source to the substrate processing chamber and the RF power source is adapted to couple RF power to the substrate processing chamber. Furthermore an RF choke coupled to the RF power source and the gas source wherein the RF choke is adapted to attenuate a voltage difference between the RF power source and the gas source to prevent plasma formation in the gas tube during substrate processing. Numerous other aspects are provided.

20 Claims, 6 Drawing Sheets

U.S. PATENT DOCUMENTS

| | | | |
|---|---|---|---|
| 5,788,778 | A | 8/1998 | Shang et al. |
| 5,815,047 | A | 9/1998 | Sorensen et al. |
| 5,824,602 | A | 10/1998 | Molvik et al. |
| 5,853,607 | A | 12/1998 | Zhao et al. |
| 5,904,487 | A | 5/1999 | Conboy et al. |
| 6,017,221 | A | 1/2000 | Flamm |
| 6,077,406 | A | 6/2000 | Kawakubo et al. |
| 6,150,628 | A | 11/2000 | Smith et al. |
| 6,251,242 | B1 | 6/2001 | Fu et al. |
| 6,453,842 | B1 | 9/2002 | Hanawa et al. |
| 6,504,464 | B2 | 1/2003 | Komiya |
| 6,572,732 | B2 | 6/2003 | Collins |
| 2002/0108713 | A1 | 8/2002 | Hanawa et al. |
| 2002/0185226 | A1* | 12/2002 | Lea et al. ............ 156/345.35 |
| 2003/0129106 | A1 | 7/2003 | Sorensen et al. |
| 2005/0066898 | A1 | 3/2005 | Schmitt et al. |
| 2007/0051388 | A1 | 3/2007 | Sorensen |
| 2008/0188033 | A1 | 8/2008 | Choi et al. |
| 2009/0197015 | A1 | 8/2009 | Kudela et al. |

FOREIGN PATENT DOCUMENTS

| | | |
|---|---|---|
| JP | 2002-145295 | 5/2002 |
| JP | 2005-244244 | 9/2005 |
| TW | 362337 | 6/1999 |
| TW | 589926 | 6/2004 |
| WO | WO 99/00823 | 1/1999 |

OTHER PUBLICATIONS

Notice of Abandonment of U.S. Appl. No. 11/514,676 mailed Oct. 11, 2011.
Y. Kitamoto et al., Compact Sputtering Apparatus for Depositing Co-Cr Alloy Thin Films in Magnetic Discs.—Proceedings of the 4th International Symposium on Sputtering and Plasma Processes, Jun. 1997, pp. 519-522.
J. Musil et al., Unbalanced Magnetrons and New Sputtering Systems with Enhanced Plasma Ionization.—Journal of Vacuum Science and Technology, vol. 9, No. 3, May/Jun. 1991, pp. 1171-1177.
B. Chapman, Glow Discharge Processes. Sputtering and Plasma Etching, pp. 257-258, 1974.
M. Yamazato et al., Preparation of Tin Thin Films by Facing Targets Magnetron Sputtering.—Proceedings of the 4th International Symposium on Sputtering and Plasma Processes, Jun. 1997, pp. 635-638.
Search Report of Taiwan Application No. 95132733 dated May 26, 2010.
Office Action of U.S. Appl. No. 10/231,867 mailed Jun. 17, 2003.
Notice of Abandonment of U.S. Appl. No. 10/231,867 mailed Apr. 8, 2004.
Office Action of U.S. Appl. No. 11/514,676 mailed May 29, 2008.
Dec. 1, 2008 Response to Office Action of U.S. Appl. No. 11/514,676 mailed May 29, 2008.
Final Office Action of U.S. Appl. No. 11/514,676 mailed Jan. 6, 2009.
Mar. 8, 2009 Response to Final Office Action of U.S. Appl. No. 11/514,676 mailed Jan. 6, 2009.
Advisory Action of U.S. Appl. No. 11/514,676 mailed Mar. 17, 2009.
May 6, 2009 Amendment filed with RCE of U.S. Appl. No. 11/514,676.
Office Action of U.S. Appl. No. 11/514,676 mailed Jun. 15, 2009.
Nov. 16, 2009 Response to Office Action of U.S. Appl. No. 11/514,676 mailed Jun. 15, 2009.
Final Office Action of U.S. Appl. No. 11/514,676 mailed Jan. 12, 2010.
Jul. 12, 2010 Amendment filed with RCE of U.S. Appl. No. 11/514,676 mailed Jan. 12, 2010.
Restriction Requirement of U.S. Appl. No. 11/514,676 mailed Jan. 30, 2008.
Feb. 29, 2008 Response to Restriction Requirement of U.S. Appl. No. 11/514,676 mailed Jan. 30, 2008.
Examiner Interview Summary of U.S. Appl. No. 11/514,676 mailed Apr. 15, 2009.
Interview Summary of U.S. Appl. No. 11/514,676, filed May 1, 2009.
Interview Summary of U.S. Appl. No. 11/514,676, filed Jul. 6, 2009.
Examiner Interview Summary of U.S. Appl. No. 11/514,676 mailed Jul. 6, 2009.
Office Action of U.S. Appl. No. 11/514,676 mailed Oct. 19, 2010.
Jan. 19, 2011 Response to Office Action of U.S. Appl. No. 11/514,676 mailed Oct. 19, 2010.
Final Office Action of U.S. Appl. No. 11/514,676 mailed Mar. 7, 2011.
Examiner Interview Summary of U.S. Appl. No. 11/514,676 mailed May 11, 2011.
Restriction Requirement of U.S. Appl. No. 12/344,210 mailed Jul. 27, 2011.
Aug. 11, 2011 Response to Restriction Requirement of U.S. Appl. No. 12/344,210 mailed Jul. 27, 2011.
Nov. 29, 2011 Response to Office Action of U.S. Appl. No. 12/344,210 (12627) mailed Aug. 29, 2011.

* cited by examiner

APPARATUS AND METHODS FOR USING HIGH FREQUENCY CHOKES IN A SUBSTRATE DEPOSITION APPARATUS

RELATED APPLICATIONS

This application is a division of, and claims priority to, U.S. Non-Provisional patent application Ser. No. 11/514,676, filed Sep. 1, 2006, and titled "APPARATUS AND METHODS FOR USING HIGH FREQUENCY CHOKES IN A SUBSTRATE DEPOSITION APPARATUS", which claims priority to U.S. Provisional Patent Application Ser. No. 60/714,723, filed Sep. 6, 2005, and titled, "APPARATUS AND METHODS FOR AN RF CHOKE". Each of these patent applications is hereby incorporated by reference herein in its entirety for all purposes.

FIELD OF THE INVENTION

The present invention relates generally to high or radio frequency (RF) chokes and specifically to RF chokes for plasma processing chambers.

BACKGROUND

With each successive technology generation, substrate processing chambers may increase in size to accommodate larger substrates. Larger substrate processing chambers may require an increase in the RF power used to perform a substrate plasma process in the substrate processing chamber. What is needed are improved methods and apparatus that allow existing processing chambers to be cost effectively enhanced to support processing operations that use higher RF powers.

SUMMARY OF THE INVENTION

The invention provides a substrate deposition apparatus, comprising a gas tube coupled to a gas source, an RF power source and a substrate processing chamber. The gas tube is adapted to carry gas from the gas source to the substrate processing chamber, and the RF power source is adapted to couple RF power to the substrate processing chamber. Furthermore, an RF choke is coupled to the RF power source and the gas source wherein the RF choke is adapted to attenuate a voltage difference between the RF power source and the gas source.

Other features and aspects of the present invention will become more fully apparent from the following detailed description, the appended claims, and the accompanying drawings.

DETAILED DESCRIPTION

Substrate processing chambers may be adapted to perform a cleaning process using a remotely generated "cleaning" plasma that is delivered to the chamber via the same channel that is used for delivering the regular process gases to the chamber. Thus, the cleaning process may use a cleaning plasma tube, which may be coupled to an RF power source, external to the substrate processing chamber. Accordingly, an RF power source may be coupled to both the substrate plasma processing chamber and the cleaning plasma tube. The cleaning plasma tube may be coupled to a gas source and the RF power source. However, this may lead to undesired electrical coupling of the RF power source to the gas delivery device. To avoid this according to the present invention, a device may be employed to electrically decouple or attenuate the voltage difference between the RF power and the gas source. This may be accomplished by placing a device such as a dielectric gas tube (e.g., ceramic plasma tube) between the RF power source and the gas delivery device that may also serve as the cleaning plasma tube. However, this may result in a localized high density electrical field, due to non uniform attenuation of the voltage difference between the gas source and the RF power source, which may cause unintended plasma in the shared dielectric gas tube/cleaning plasma tube during substrate processing.

A more uniform attenuation of the voltage may allow relatively higher RF power to be delivered to the substrate processing chamber before plasma is ignited in the plasma tube. In other words, the present invention may be used to prevent process plasma from forming in the cleaning plasma tube during substrate processing using higher RF powers. A resistor may be placed between RF power source and the gas delivery apparatus and may ensure an approximately uniform attenuation of voltage difference between the RF power source and the gas delivery system. However, the resistor may be expensive, susceptible to damage and take up an undesired amount of volume. Therefore, there may be a desire for an inexpensive, compact apparatus adapted to ensure an approximately uniform attenuation of the voltage from the RF power source and the gas delivery apparatus.

In accordance with the present invention, an RF choke is provided. In a first embodiment, the RF choke may include a wire wrapped around a hollow plastic core or form. The plastic core may include grooves machined into the surface so as to allow the wire to form a coil traversing the length of the plastic core. Alternatively, in a second embodiment of the RF choke, a wire with a dielectric coating may be provided. The pitch between the wires may be established by the thickness of the dielectric coating on the conductive portion of the wire when the wire may be wrapped around an object such as a form or a tube.

The RF choke may be electrically coupled to a gas source, an RF power source and a substrate processing chamber. The coupling of the RF choke, or specifically, the coiled wire to the RF power source and the gas source, may induce a voltage drop along the length of the wire. By providing a wire wrapped into a coil, in accordance with the first two embodiments, an approximately uniform voltage drop along the length of the wire may be realized. Thereby, the voltage drop that induces plasma in the substrate processing chamber and/or gas tube may be realized and/or repeatable. These aspects of the invention are discussed below.

Figure 1:
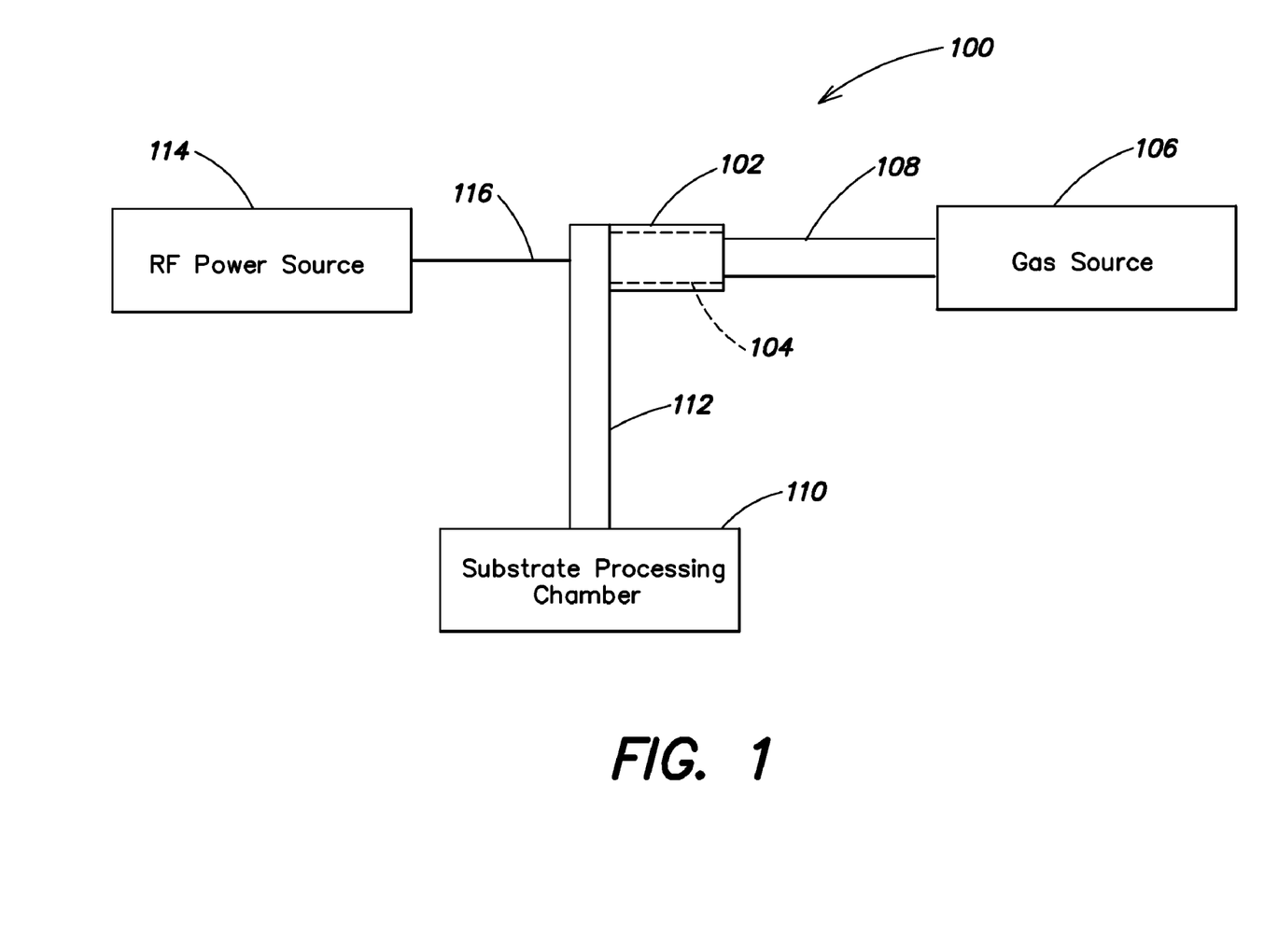
FIG. 1 is a schematic diagram depicting a substrate processing apparatus in accordance a first embodiment of the present invention.

FIG. 1 is a schematic drawing depicting a substrate processing apparatus 100 in accordance a first embodiment of the present invention. The substrate processing apparatus 100 (e.g., embodied as Plasma Chamber Models 15K, 20K, 25K and/or 25KA manufactured by AKT, Inc. of Santa Clara, Calif.) may include an inventive RF choke 102 disposed coaxially around a gas tube 104. The gas tube 104 (e.g., formed from ceramic, quartz, and/or the like) may be coupled to a gas source 106 (e.g., a gas panel, gas lines, and/or the like) via a gas delivery device 108 (e.g., stainless steel gas line, gas distribution block, and/or the like). Furthermore, the gas tube 104 may be coupled to the substrate processing chamber 110 via a chamber distribution device 112 (e.g., stainless steel tubing, machined copper block, shower head, and/or the like). The RF choke 102, which may be disposed coaxially around the gas tube 104, may be electrically coupled to the gas delivery device 108. As previously discussed, the gas delivery device 108 may be coupled to the gas source 106. In addition, the RF choke 102 may be coupled to the RF power source 114 (e.g., RF generator and matching network, variable frequency network, and/or the like) via an RF delivery device 116 (e.g., a coaxial cable, bus bar, and/or the like).

With reference to FIG. 1, during a substrate fabrication process in the substrate processing apparatus 100, the RF power source 114 may couple RF power to both the RF choke 102 and/or the substrate processing chamber 110. Furthermore, the gas source 106 may provide process gases to the substrate processing chamber 110 via the gas delivery device 108, gas tube 104 and/or chamber distribution device 112. In this manner, plasma may be formed in the substrate processing chamber 110 and/or gas tube 104.

Still with reference to FIG. 1, plasma may be formed in the substrate processing chamber 110 by flowing gas and coupling RF power to the chamber distribution device 112. The plasma may be employed to perform material removal and/or deposition processes (e.g., CVD, etch and/or the like) on the substrate. During the material removal and/or deposition processes, the voltage level of the chamber distribution device 112 (Vbs) may be known and/or repeatable so as to induce plasma in the substrate processing chamber 110 without forming plasma in the gas tube 104.

Alternatively, there may be a need to perform a clean process in the substrate processing chamber 110. The clean process may be performed by flowing cleaning plasma gas to the gas tube 104 via the gas delivery device 108 (e.g., remote plasma clean source). During the flow of the cleaning plasma gas, the RF power source 114 may couple RF power to the RF choke 102 via the RF delivery device 116. In this manner, plasma may be maintained in the gas tube 104. Furthermore, the voltage level of the chamber distribution device 112 (Vbt) that induces plasma in the gas tube 104 may be known. The plasma may provide reactive species such chlorine which may flow to the substrate processing chamber 110 via the chamber distribution device 112 to perform the clean process.

Still with reference to FIG. 1, plasma in the gas tube 104 may be maintained in a known and/or repeatable manner by controlling the distribution of the voltage along the length of the RF choke 102. For example, by having an approximately uniform distribution of voltage along the length of the RF choke 102, the RF power output by the RF power source 114 that may maintain plasma (and/or in some embodiments, induce plasma or prevent reactive species from recombining into a more stable state) in the gas tube 104 may be determined and thereby be more predictable and/or repeatable. Additionally, different gas compositions flowed from the remote plasma gas source 106 to the gas tube 104 may form plasma at different Vbt voltage levels. Thus, for a variety of gas compositions, the voltage level Vbt that may induce plasma in the gas tube 104 may be known and/or repeatable.

Figure 2:
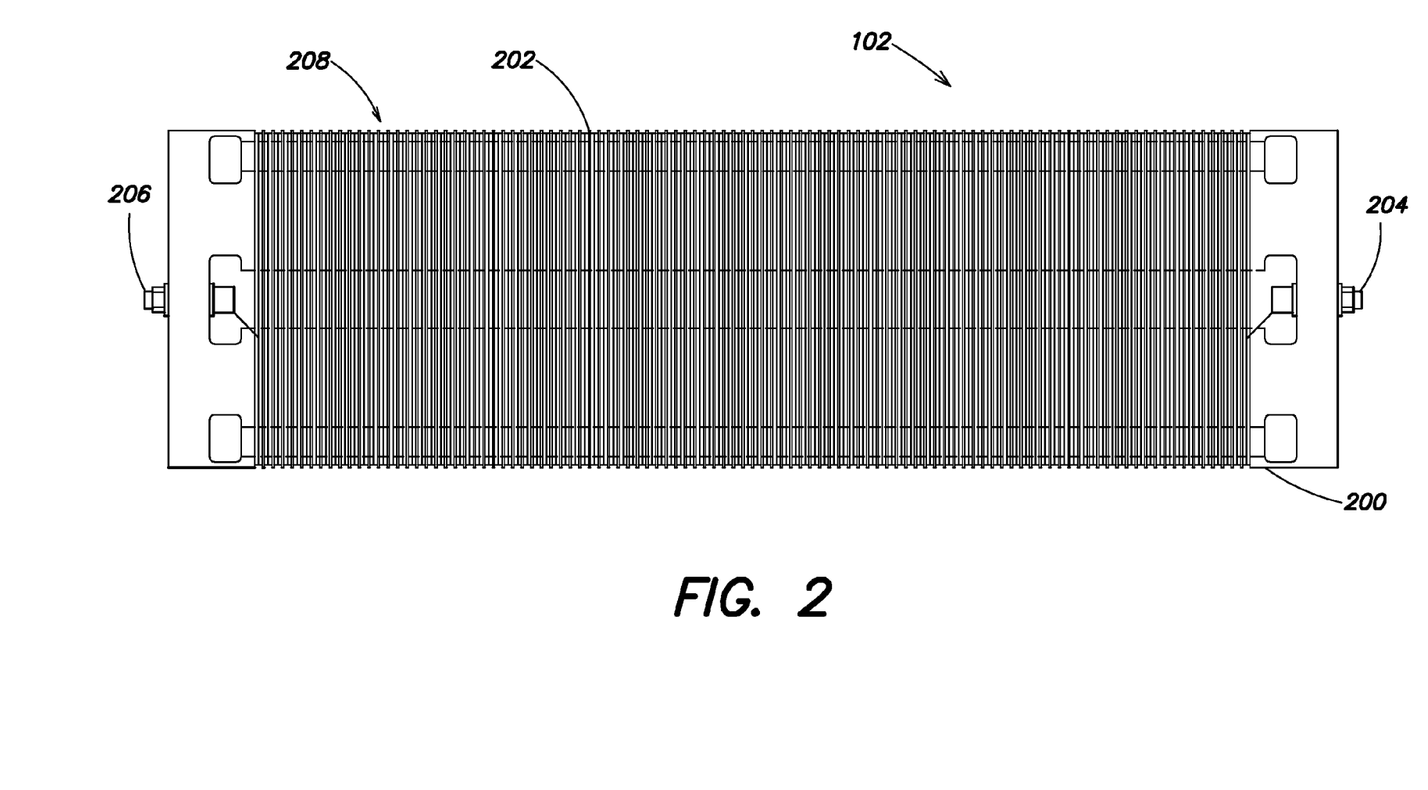
FIG. 2 is a perspective diagram depicting the RF choke of FIG. 1 in accordance with the first embodiment of the present invention.

FIG. 2 is a perspective drawing depicting the RF choke 102 in accordance the first embodiment of the present invention. The RF choke 102 may include a core 200 (e.g., hollow plastic cylinder or the like) a coiled wire 202 (e.g., 17 AWG nickel-chromium or the like), a gas end bolt 204 (e.g., stainless steel threaded bolt or the like) and a RF end bolt 206 (e.g., stainless steel threaded bolt or the like).

With reference to FIG. 2, the core 200 may be disposed internal to the approximately cylindrical geometry formed by the coiled wire 202 and serve as a form to support the coiled wire 202. Furthermore, the core 200 may include a continuous groove 208 on the surface in which the coiled wire 202 may be disposed to maintain the position of the wire and prevent short circuiting of coils. On a first end of the core 200 the gas end bolt 204 may be coupled to both the coiled wire 202 and the core 200. A portion of the gas end bolt 204 may protrude from a first end of the core 200. Additionally, the RF end bolt 206 may be coupled to both the coiled wire 202 and the core 200. A portion of the RF end bolt 206 may protrude from a second end of the core 200. The coiled wire 202 may be coupled to the RF delivery device 116 via the RF end bolt 206. In addition, the coiled wire 202 may also be coupled to the gas delivery device 108 via the gas end bolt 204.

Still with reference to FIG. 2, during the substrate and/or clean process the RF end bolt 206 may be electrically excited to a voltage, Vbs and/or Vbt or any other suitable voltage, by the RF power source 114. In addition, the gas end bolt 204 may be at or near earth ground voltage (e.g., near zero voltage or the like). Thus, the coiled wire 202 may have a voltage drop along the length of the wire that is approximately equal to Vbs and/or Vbt or any other suitable voltage. Furthermore, the voltage drop along the length of the coiled wire 202 may be approximately uniform. By having an approximately uniform voltage drop that may be approximately equal to Vbs and/or Vbt or any other suitable voltage, the RF power output from the RF power source 114 which may maintain (or induce ignition of) the plasma in the gas tube 104 and/or substrate processing chamber 110 may be approximately determined and/or repeatable.

Figure 3:
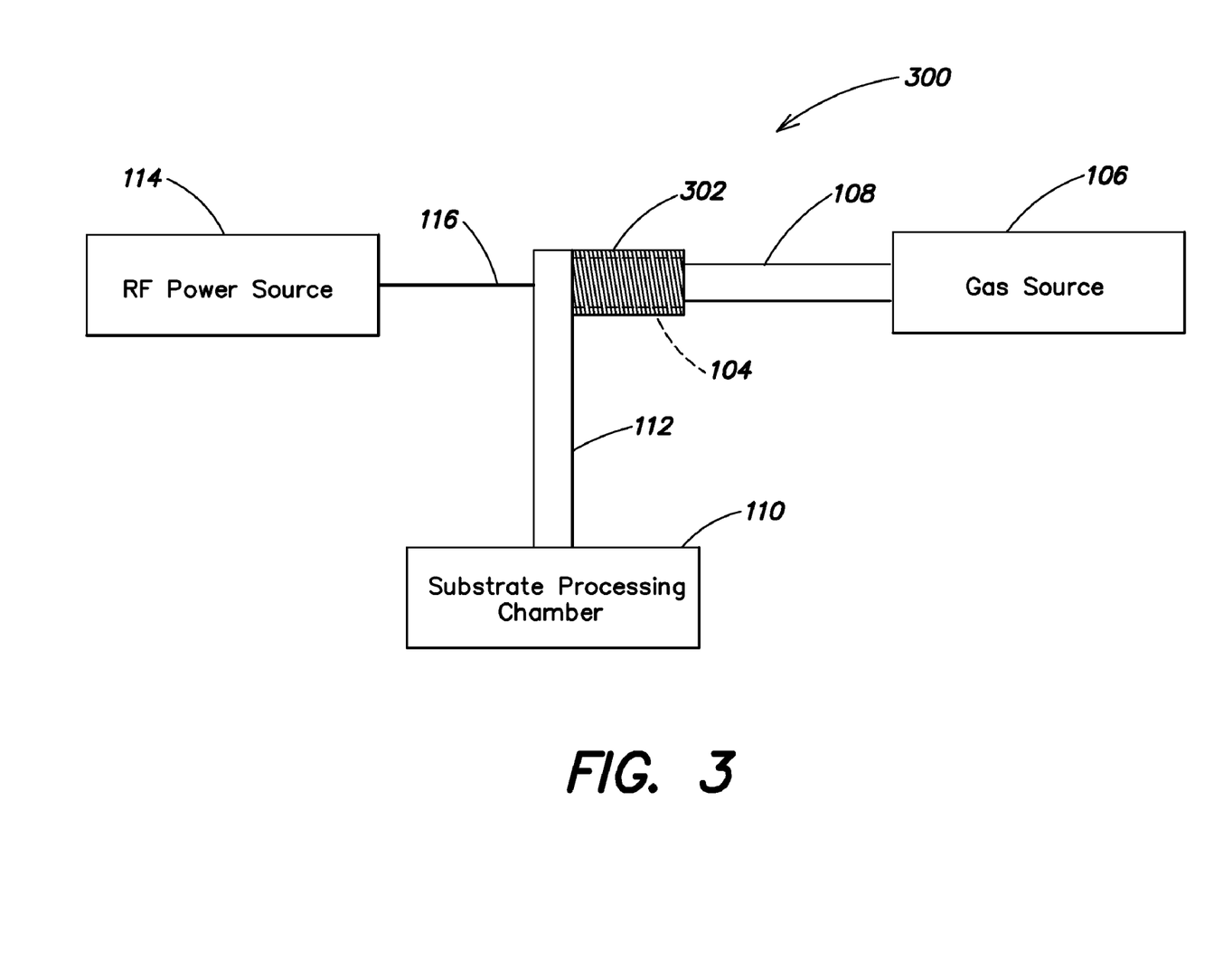
FIG. 3 is a schematic diagram depicting a substrate processing apparatus in accordance with a second embodiment of the present invention.

FIG. 3 is a schematic drawing depicting a substrate processing apparatus 300 in accordance a second embodiment of the present invention. The substrate processing apparatus 300 may include an insulated RF choke 302 disposed around the gas tube 104. The gas tube 104 may be coupled to the gas source 106 via a gas delivery device 108. Furthermore, the gas tube 104 may be coupled to the substrate processing chamber 110 via a chamber distribution device 112. The insulated RF choke 302, which may be disposed around the gas tube 104, may be electrically coupled to the gas delivery device 108. As previously discussed, the gas delivery device 108 may be coupled to the gas source 106. In addition, the insulated RF choke 302 may be coupled to the RF power source 114 (e.g., RF generator and matching network, variable frequency network, and etc.) via a RF delivery device 116 (e.g., coaxial cable, bus bar and etc.)

Figure 4:
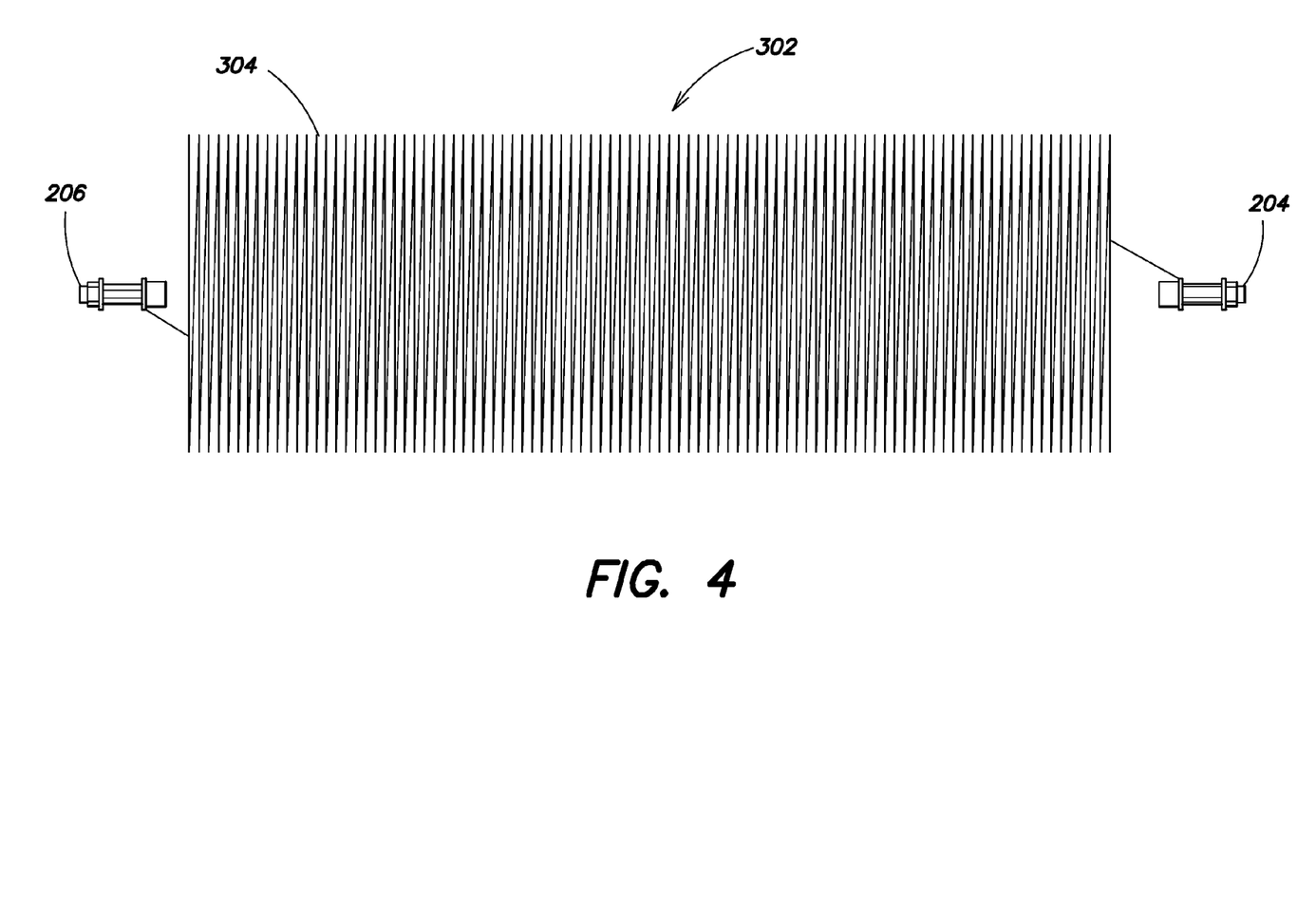
FIG. 4 is a perspective diagram depicting the RF choke of FIG. 3 in accordance with a second embodiment of the invention.

FIG. 4 is a perspective drawing depicting an RF choke 302 in accordance with a second embodiment of the invention. The insulated RF choke 302 may include an insulated coiled wire 304, the gas end bolt 204 and the RF end bolt 206. The gas end bolt 204 may couple the insulated RF choke 302 to the gas delivery device 108. Furthermore, the RF end bolt 206 may couple the insulated RF choke 302 to the chamber distribution device 112.

Similar to the first embodiment in operation, during the substrate and/or clean process, the RF end bolt 206 may be electrically excited to a voltage by the RF power source 114. In addition, the gas end bolt 204 may be at a voltage level near earth ground. Thus, the insulated coiled wire 304 may have a voltage drop along the length of the wire that is approximately equal to voltage Vbs and/or Vbt or any other suitable voltage. Furthermore, the voltage drop along the length of the insulated coiled wire 304 may be approximately uniform. In this manner, the RF power output from the RF power source 114 which may induce ignition of the plasma in the gas tube 104 may be approximately known and/or repeatable.

Figure 5:
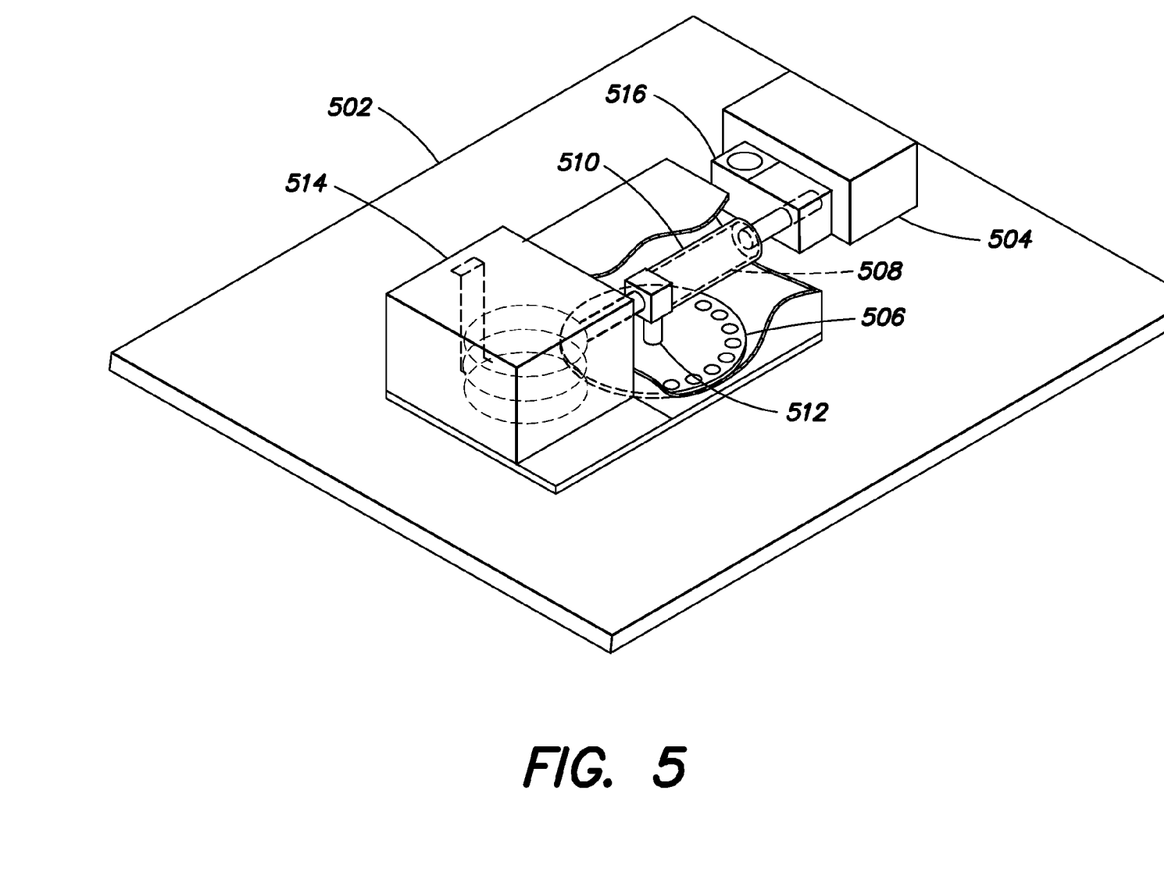
FIG. 5 is a perspective view of a top portion of a substrate processing apparatus in accordance with a third embodiment of the present invention.

Turning to FIG. 5, a lid 502 of a processing chamber is depicted including a remote cleaning plasma source 504 in fluid communication with a diffuser 506 (leading into the processing chamber) via a gas tube 508 surrounded by an RF choke 510. The lid 502 may be employed to couple energy (e.g., RF, microwave, etc.) to a fluid and distributing the fluid to the processing chamber. The gas tube 508 may be coupled to the diffuser 506 via a gas input 512. A matching network 514 may be coupled to the RF choke 510 and the lid 502. A grounded connector 516 may couple the remote cleaning plasma source 504 and the RF choke 510 to electrical ground (e.g., approximately zero volts).

With reference to FIG. 5, the remote cleaning plasma source 504 may provide a fluid. The fluid may be employed in the processing chamber to process substrates, clean the chamber, or any other suitable purpose. The fluid may be fluid (e.g., gas, vaporized water, etc.) or any other fluid suitable for use in the processing chamber. Additionally or alternatively, the fluid may be ionized (e.g., into a plasma) or imparted other similar characteristics so as to perform the processes in the processing chamber. The remote cleaning plasma source 504 may comprise aluminum and/or any material suitable to provide the fluid. For example, in the same or alternative embodiments, portions of the remote cleaning plasma source 504 may include ceramic parts to ensure that energy (e.g., electrical) is not exchanged between the fluid and the lid.

The remote cleaning plasma source 504 may be adapted to provide a fluid for processing. For example, the remote cleaning plasma source 504 may be adapted to vaporize water to form gaseous water (e.g., steam). Such fluid may be employed by the processing chamber.

The diffuser 506 may comprise anodized aluminum although any suitable material may be employed to distribute the fluid. As depicted in FIG. 5, the diffuser 506 may have a flat circular shape although any suitable shape and/or configurations of shapes may be employed. The diffuser 506 may also have holes adapted to pass the fluid to the processing chamber. As discussed above the diffuser 506 may be in fluid communication with the remote cleaning plasma source 504 via the gas tube 508.

The diffuser 506 may be employed to distribute the fluid in a desired manner. For example, it may be desired to distribute the fluid evenly inside the processing chamber to ensure uniform processing. Alternatively, the diffuser 506 may distribute the fluid in a non-uniform manner to ensure that the fluid concentrates in desired regions of the processing chamber.

As depicted in FIG. 5, the gas tube 508 may be a single circular tube 508 although any suitable shapes and/or configuration of shapes may be employed. The gas tube 508 may comprise anodized aluminum although any suitable material or combination of materials may be employed.

The gas tube 508 may be adapted to convey the fluid from the remote cleaning plasma source 504 to the diffuser 506. The gas tube 508 may also insulate (e.g., electrically) the fluid from electrical or other energy sources. By insulating the fluid from the energy sources, the gas tube 508 may ensure that a desired amount of energy is coupled to the fluid. In addition or alternatively, the gas tube 508 may be adapted to hold other components of the present invention. For example, as will be discussed below, the gas tube 508 may be adapted to mechanically support other components of the present invention.

Still with reference to FIG. 5, the RF choke 510 may be disposed around the gas tube 508. The RF choke 510 is depicted as a single coil disposed around the gas tube 508 although other suitable configurations may be employed. Similar to the embodiment described above with reference to FIGS. 1-4, the RF choke 510 may be employed to couple energy to the fluid being conveyed by the gas tube 508. The gas input 512 may comprise aluminum although any suitable material may be employed. The gas input 512 is depicted in FIG. 5 as cube shaped although any suitable shape may be employed. The gas input 512 may be adapted to couple the gas tube 508 to the diffuser 506. The gas input 512 may be employed to convey the fluid from the gas tube 508 to the diffuser 506. In the same or alternative embodiments, the gas input 512 may be employed to electrically insulate the diffuser 506 from the gas tube 508.

The matching network 514 may be coupled to the RF choke 510 and the lid 502. The matching network 514 may include other components that are not discussed in detail in this application. The components may be inductors and/or capacitors although other suitable components may be employed. The external shell of the matching network 514 may be aluminum although any suitable material may be employed.

The matching network 514 may be adapted to couple a source (e.g., electrical) to the lid 502 via the choke 510. The matching network 514 may be employed to match the electrical load presented to the matching network 514 (e.g., electrical load of the processing chamber, RF choke, etc.) to the load of the source. In the same or alternative embodiments, the matching network 514 may couple energy to the processing chamber via the RF choke 510.

The grounded connector 516 may comprise aluminum although any suitable material may be employed. The grounded connector 516 is depicted in FIG. 5 as a cube shaped device although any suitable shape may be employed. The grounded connector 516 may be adapted to couple an end of the RF choke 510 to ground. In the same or alternative embodiments, the grounded connector 516 may also be coupled to the remote cleaning plasma source 504. By coupling an end of the RF choke 510 to ground, the energy being coupled to the RF choke 510 via the matching network 514 may be coupled to ground through the RF choke.

Figure 6A:
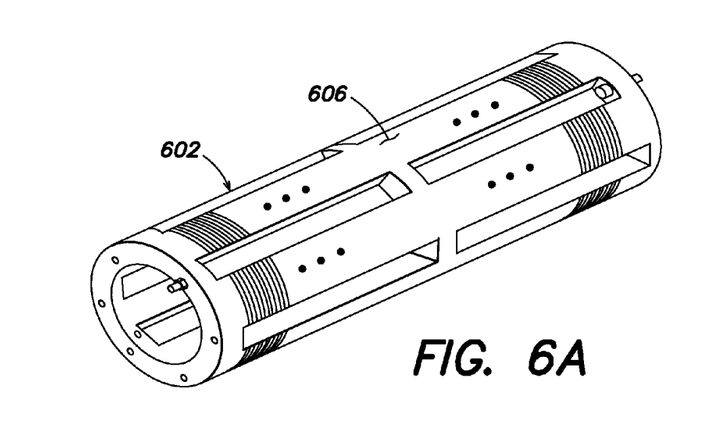
FIGS. 6A, 6B, 6C and 6D are perspective, side, end, and detail views, respectively, of an RF choke in accordance with a third embodiment of the invention.
Figure 6B:
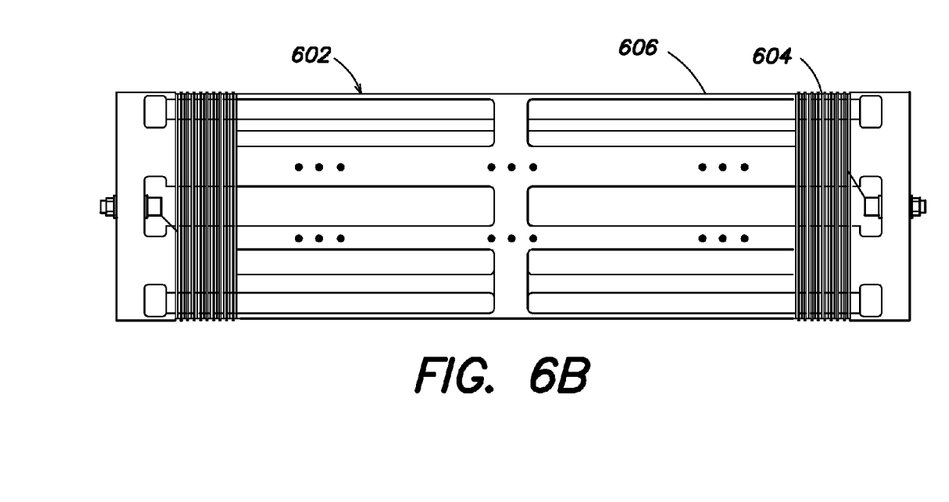
Figure 6C:
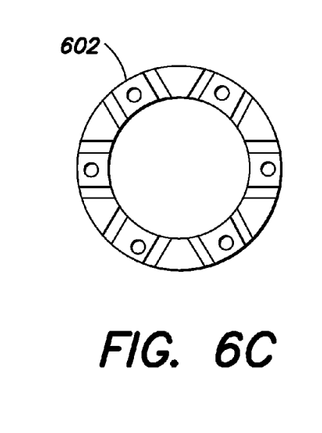
Figure 6D:
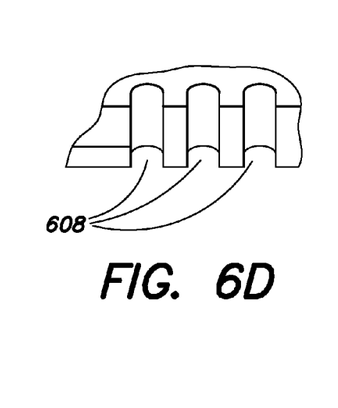

FIG. 6A depicts a perspective view of an RF choke form 602 adapted to receive and support a conductive coil 604 (which is partially shown wrapped about the form) coaxially about the gas tube 508 of FIG. 5. FIGS. 6B and 6C depict side and end views of the form of FIG. 6A. FIG. 6D depicts a close-up detail view of grooves milled into the surface of the form to space and insulate the conductive coils from each other. Note that the drawings are not to scale and the dimensions may be adjusted to accommodate different sized chambers that use different amounts of RF power. For example, the Plasma Chamber Model 40K manufactured by AKT, Inc. may use a longer RF choke than the Model 25K or 15K mentioned above.

The RF choke form 602 may comprise a plastic such as polyamide although any suitable material may be employed.

For example, the RF choke form 602 may comprise a ceramic material in addition to other materials. The RF choke form 602 may be adapted to receive and support the conductive coil 604, as will be described below with reference to FIGS. 6B and 6D.

With reference to FIG. 6B, the RF choke form 602 may have the conductive coil 604 wrapped around the external surface 606 of the RF choke form 602. Note that the conductive coil may comprise a continuous wire wrapped around the RF choke form 602. In the same or alternative embodiments, it may be desired to control the space between each loop of the wire. Accordingly, the RF choke form 602 may be adapted to control the space, as will be described below.

With reference to FIG. 6D, the RF choke form 602 may be adapted to receive and hold the conductive coil 604 with a groove 608 in the external surface 606 of the RF choke form 602. The conductive coil 604 may be disposed in the grooves 608.

Although the groove 608 is depicted as u-shaped valleys, any suitable shape may be employed. For example, in an alternative embodiment, the groove 608 may be v-shaped or rectangular shaped. The groove 608 may be any suitable depth suitable for controlling the depth of the wire of the conductive coil 604 in the groove 608. Also, as depicted in FIG. 6D, the groove 608 is a continuous feature along the length of the RF choke form 602. In alternative embodiments, the groove 608 may comprise a plurality of features.

The foregoing description discloses only exemplary embodiments of the invention. Modifications of the above disclosed apparatus and method which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A method, comprising:
    providing a gas tube, a gas source, an RF power source and a substrate processing chamber;
    carrying gas from the gas source to the substrate processing chamber via the gas tube;
    coupling RF power to the substrate processing chamber;
    providing an RF choke;
    attenuating a voltage difference between the RF power source and the gas source with the RF choke.

2. The method of claim 1, wherein providing an RF choke includes disposing the RF choke around the gas tube.

3. The method of claim 1, wherein providing an RF choke includes providing a wire wrapped into a coil.

4. The method of claim 3, wherein providing a wire wrapped into a coil includes disposing the wire around the gas tube.

5. The method of claim 4, wherein disposing the wire around the gas tube further includes ensuring the pitch of the wire is substantially constant.

6. The method of claim 1, wherein providing a gas tube includes providing dielectric material.

7. The method of claim 6, wherein providing the RF choke includes providing a wire wrapped into a coil.

8. The method of claim 7, wherein providing a wire wrapped into a coil includes disposing the wire around the gas tube.

9. The method of claim 8, wherein disposing the wire around the gas tube further includes ensuring the pitch of the wire is substantially constant.

10. The method of claim 3, wherein providing a wire wrapped into a coil includes providing a wire coated with dielectric material.

11. The method of claim 10, wherein providing a wire coated with a dielectric material includes disposing the wire coated with a dielectric material around the gas tube.

12. A method of operating a processing chamber, comprising:
    providing a first channel for a plasma gas flow to a processing chamber;
    providing a second channel including a gas tube for flowing a cleaning plasma gas to the processing chamber via the first channel;
    providing an RF choke; and
    restricting plasma from the processing chamber from flowing into the second channel using the RF choke during plasma processing in the chamber.

13. The method of claim 12, wherein providing an RF choke includes disposing the RF choke around the gas tube.

14. The method of claim 12, wherein providing an RF choke includes providing a wire wrapped into a coil.

15. The method of claim 14, wherein providing a wire wrapped into a coil includes disposing the wire around the gas tube.

16. The method of claim 15, wherein disposing the wire around the gas tube further includes ensuring the pitch of the wire is substantially constant.

17. The method of claim 12, wherein providing a second channel including a gas tube includes providing dielectric material.

18. The method of claim 17, wherein providing the RF choke includes providing a wire wrapped into a coil.

19. The method of claim 18, wherein providing a wire wrapped into a coil includes disposing the wire around the gas tube.

20. The method of claim 19, wherein disposing the wire around the gas tube further includes ensuring the pitch of the wire is substantially constant.

* * * * *